(12) United States Patent
Glorioso et al.

(10) Patent No.: US 6,301,105 B2
(45) Date of Patent: Oct. 9, 2001

(54) DISK DRIVE ENCLOSURE

(75) Inventors: Scott R. Glorioso, Littelton; Daniel H. Kass, Maynard; Clifford G. Westland, Chelmsford; Erica M. Jehu, Andover; Morton H. Tarr, Bolton, all of MA (US)

(73) Assignee: Avid Technology, Inc., Tewksbury, MA (US)

( * ) Notice: Subject to any disclaimer, the term of this patent is extended or adjusted under 35 U.S.C. 154(b) by 0 days.

(21) Appl. No.: 09/779,262

(22) Filed: Feb. 8, 2001

Related U.S. Application Data

(62) Division of application No. 09/170,386, filed on Oct. 13, 1998.

(51) Int. Cl.[7] .................................................. G11B 33/08
(52) U.S. Cl. ........................ 361/685; 361/801; 248/634; 248/635; 360/98.01
(58) Field of Search .................................. 361/685, 727, 361/801, 732, 747, 759, 726; 248/581, 611, 615, 634–635, 638; 360/97.01, 137, 98.01; 70/85

(56) References Cited

U.S. PATENT DOCUMENTS

| | | | |
|---|---|---|---|
| Re. 35,915 | * 10/1998 | Hastings et al. | 439/377 |
| 4,831,476 | * 5/1989 | Branc et al. | 360/97.02 |
| 4,926,291 | 5/1990 | Sarraf | 361/384 |
| 5,042,024 | * 8/1991 | Kurosawa et al. | 369/75.1 |
| 5,212,681 | * 5/1993 | Bock et al. | 369/244 |

(List continued on next page.)

FOREIGN PATENT DOCUMENTS

| | | | |
|---|---|---|---|
| 295 07 992 U1 | 9/1995 | (DE) | G11B/33/02 |
| 296 04 709 U1 | 8/1996 | (DE) | H05K/5/02 |
| 0 210 497 A2 | 2/1987 | (EP) | G11B/33/14 |
| 0 635 836 A1 | 1/1995 | (EP) | G11B/33/14 |
| 0 841 666 A1 | 5/1998 | (EP) | G11B/33/12 |
| 2 273 811 A | 6/1994 | (GB) | G11B/5/54 |
| WO 93/24932 | 12/1993 | (WO) | G11B/33/14 |

OTHER PUBLICATIONS

"Modular Libraries, Drives, and Power Systems," IBM Technical Disclosure Bulletin, vol. 38, No. Jan. 1995, pp. 341–342.

*Primary Examiner*—Leo P. Picard
*Assistant Examiner*—Hung Van Duong
(74) *Attorney, Agent, or Firm*—Peter J. Gordon

(57) ABSTRACT

Noise is reduced in a disk drive enclosure by using vibration damping materials on the inside surface of the enclosure. These materials and their placement on the inside surface of the enclosure reduce noise without thermally insulating the disk drive. A temperature controlled fan may be used to remove heat by convection while generating a minimum amount of noise. The connection between the disk drive and the external connector of the disk drive enclosure is made more reliable by using a printed circuit board instead of a cable. Because a printed circuit board has a fixed location and fixed layout, variability among disk drive enclosures can be minimized. Also, errors in manufacturing of the disk drive enclosure can be reduced. To facilitate the use of the disk drive in a stripe set, the disk drive enclosure has a set of mechanical interlocks that permit the enclosures to be stacked vertically. In one embodiment, the mechanical interlocks are constructed in a manner that permits stacking in unlocked and locked configurations. The locked configuration may be made permanent using an additional locking mechanism. These mechanical interlocks also may be used to support the enclosure on a desktop. The mechanical interlocks also may be constructed so that they can slide on a rail, permitting the enclosure to be used in a rack mount. The rack mount also may be provided with a quick-release mechanism that interacts with the mechanical interlocks to hold the disk drive enclosure in the rack mount.

8 Claims, 15 Drawing Sheets

U.S. PATENT DOCUMENTS

| | | | |
|---|---|---|---|
| 5,255,256 | * 10/1993 | Engler et al. | 369/77.2 |
| 5,333,097 | 7/1994 | Christensen et al. . | |
| 5,335,217 | * 8/1994 | Kaneda et al. | 369/77.2 |
| 5,355,121 | 10/1994 | Naito et al. | 340/584 |
| 5,493,457 | * 2/1996 | Kawamura | 369/75.1 |
| 5,511,055 | 4/1996 | Otsuki et al. | 369/75.1 |
| 5,564,802 | 10/1996 | Chiou | 312/111 |
| 5,587,854 | * 12/1996 | Sato et al. | 360/97.01 |
| 5,587,889 | * 12/1996 | Sacherman | 361/727 |
| 5,627,415 | * 5/1997 | Charpentier et al. | 307/116 |
| 5,663,943 | * 9/1997 | Yanagisawa et al. | 369/75.1 |
| 5,694,314 | * 12/1997 | Aoki et al. | 369/77.2 |
| 5,930,738 | * 7/1999 | Jones | 702/132 |
| 6,002,658 | * 12/1999 | Aso et al. | 369/75.1 |
| 6,005,768 | * 12/1999 | Jo | 361/685 |
| 6,029,119 | * 2/2000 | Atkinson | 702/132 |
| 6,086,476 | * 7/2000 | Paquin et al. | 454/184 |

\* cited by examiner

DISK DRIVE ENCLOSURE

This is a divisional of patent application Ser. No. 09/170,386, filed Oct. 13, 1998, pending.

BACKGROUND

A disk drive for a computer commonly is placed in an enclosure in order to, for example, protect or cool the disk drive. An enclosure commonly includes one or more external electrical connectors that are connected inside the enclosure by a cable to the disk drive. An enclosure may be constructed to be placed in rack equipment or may be constructed to be placed on a desktop.

Advances in disk drive technology that provide greater storage density and access speeds also are accompanied by problems caused by higher power consumption and revolutions per minute of the disk drive. These problems include increased heat and increased noise. Techniques for reducing noise tend to be thermally insulating and thus increase heat around a disk drive. Techniques for reducing heat by convection, such as rotating fans, tend to create noise. The use of conduction to dissipate heat, such as by a heat sink, often is ineffective to adequately cool the disk drive, because integrated circuits in a disk drive generally do not have a heat conduction path from within the disk drive to a heat sink.

Other reliability problems are associated with the cable that connects the disk drive to the external connector of the enclosure. For example, the impedance of a cable is affected by its proximity to both devices within the enclosure and the enclosure itself. Because a cable may be placed in many locations within an enclosure, the impedance of the cable can vary significantly from enclosure to enclosure. Single-ended small computer systems interface (SCSI) signals and low voltage differential (LVD) signals are particularly sensitive to such variations in impedance. The cable also can become loose after manufacturing, or can be installed incorrectly.

Another reliability problem arises when data is striped, i.e., a data word is divided and written in parallel, to a set of disk drives. Such a set of disk drives is called a stripe set. After data is stored on a stripe set, the order of the disks in the stripe set must be maintained in order to maintain data integrity. The exact physical arrangement of the disk drive enclosures for the stripe set, for example in a stack, ideally would be maintained in order to ensure data integrity. Some users actually resort to using adhesive tape or other physical measures to bind the set of disk drive enclosures together.

These problems are particularly undesirable in computing environments where high reliability and low noise are expected, such as in professional multimedia authoring studios. Computer systems in such environments typically use a large amount of disk capacity, particularly if the disks are used for storing audio and video information. The large number of disks both creates a significant amount of noise and increases concern for reliability.

SUMMARY

Noise is reduced in a disk drive enclosure by using vibration damping materials on the inside surface of the enclosure. These materials and their placement on the inside surface of the enclosure reduce noise without thermally insulating the disk drive. A temperature controlled fan may be used to remove heat by convection while generating a minimum amount of noise.

The connection between the disk drive and the external connector of the disk drive enclosure is made more reliable by using a printed circuit board instead of a cable. Because a printed circuit board has a fixed location and fixed layout, variability among disk drive enclosures can be minimized. Also, errors in manufacturing of the disk drive enclosure can be reduced.

To facilitate the use of the disk drive in a stripe set, the disk drive enclosure has a set of mechanical interlocks that permit the enclosures to be stacked vertically. In one embodiment, the mechanical interlocks are constructed in a manner that permits stacking in unlocked and locked configurations. The locked configuration may be made permanent using an additional locking mechanism. These mechanical interlocks also may be used to support the enclosure on a desktop. The mechanical interlocks also may be constructed to slide on a rail, permitting the enclosure to be used in a rack mount. A rack mount configuration also may be provided with a quick-release mechanism that interacts with the mechanical interlocks to hold the disk drive enclosure in the rack mount.

Accordingly, in one aspect, a disk drive enclosure has a housing for enclosing a disk drive. A vibration dampening material is applied to the inside surface of the housing. A temperature sensor is mounted inside the housing adjacent to the disk drive. The temperature sensor has an output to provide an electrical signal indicative of ambient temperature in the housing. A control circuit has an input connected to the output of the temperature sensor and an output to provide a control signal as a function of the temperature sensor. A fan has an input connected to the control signal and is responsive to the control signal to rotate at a speed corresponding to the control signal. In one embodiment, the control signal varies according to the temperature in the housing within a range of temperatures, whereby the speed of the fan is variable according to the control signal. In another embodiment, a threshold circuit has an input connected to the output of the temperature sensor and an output to provide an alarm signal indicating one of a plurality of ranges in which the temperature is sensed. An indicator has an input connected to the output of the threshold circuit and is responsive thereto to provide a visual indication of the range in which the temperature is sensed.

In another aspect, the disk drive enclosure has a housing for enclosing a disk drive. A first plurality of mechanical interlocks is mounted on a first side of the housing. A second plurality of mechanical interlocks is mounted on a second side of the housing opposite the first side of the housing. Each of the first and second plurality of mechanical interlocks has a top portion having a surface complementary to a surface of a bottom portion of the mechanical interlock, such that the top portion of a first mechanical interlock and the bottom portion of a second mechanical interlock are slidably connectable in a first direction. When connected, the mechanical interlocks prohibit movement of the mechanical interlocks with respect to each other in second and third directions orthogonal to the first direction. In one embodiment, the top portion has top face and the bottom portion has a bottom face such that the top face of the top portion of a first mechanical interlock supports the bottom face of the bottom portion of a second mechanical interlock when enclosures on which the first and second mechanical interlocks are attached are vertically aligned and stacked. In another embodiment, each of the first and second plurality of mechanical interlocks has portion having a surface complementary to a surface of a support in a rack, such that the portion of the mechanical interlock and the support in the rack are slidably connectable in a first direction and when connected prohibit movement of the mechanical interlock with respect to support in second and third directions orthogonal to the first direction. In still another embodiment, a locking mechanism has a first movable member and is mounted on the first side of the housing. In another aspect, a disk drive enclosure, for mounting in a rack having a support, has a housing for enclosing a disk drive. A first plurality of mechanical interlocks is mounted on a first side of the housing. A second plurality of mechanical interlocks is mounted on a second side of the housing opposite the first side of the housing. Each of the first and second plurality of mechanical interlocks has portion having a surface complementary to a surface of the support in the rack, such that the portion of the mechanical interlock and the support in the rack are slidably connectable in a first direction and when connected prohibit movement of the mechanical interlock with respect to support in second and third directions orthogonal to the first direction.

In another aspect, a printed circuit board is constructed for use in connecting a first connector on a disk drive to a second and third connectors on a disk drive enclosure, wherein the first connector has a plurality of pins providing a plurality of corresponding signals, and wherein the second and third connectors each receive the plurality of corresponding signals, The printed circuit board includes a plurality of layers of material. A plurality of traces are placed in a layout on the layers of material, wherein each trace corresponds to one of the plurality of signals from the first connector, wherein the plurality of signals includes an acknowledge signal and a request signal, and wherein the trace for the acknowledge signal and the trace for the request signal are the same length. In one embodiment, the plurality of signals includes a termination power signal, and wherein the trace for the termination power signal is thicker than the traces for the other signals. In another embodiment, the impedance of the traces for the acknowledge and request signals is 90_6 Ohms. In still another embodiment, the impedance of the traces for the plurality of signals is 90_10 Ohms. In yet another embodiment, a first connector is attached to a first surface of the printed circuit board and a second connector is attached to the printed circuit board on a second surface opposite the first surface. In yet another embodiment, a first connector is attached to a first surface of the printed circuit board, and a second connector is attached to the first surface of the printed circuit board. A temperature sensor also may be mounted on the printed circuit board, which has an output to provide an electrical signal indicative of ambient temperature around the temperature sensor. A control circuit may be mounted on the printed circuit board which has an input connected to the output of the temperature sensor and an output to provide a control signal as a function of the temperature sensor.

In another aspect, a mechanical interlock for use with a disk drive enclosure has a top portion, a bottom portion and a section connecting the top portion to the bottom portion, wherein the top portion has a surface complementary to a surface of the bottom portion, such that the top portion of a first mechanical interlock and the bottom portion of a second mechanical interlock are slidably connectable in a first direction and when connected prohibit movement of the mechanical interlocks with respect to each other in a second and directions orthogonal to the first direction. The top portion has top face and the bottom portion has a bottom face such that the top face of the top portion of a first mechanical interlock supports the bottom face of the bottom portion of a second mechanical interlock when enclosures on which the first and second mechanical interlocks are attached are vertically aligned and stacked.

Another aspect is a rack mount for a disk drive enclosure having at least one bay for receiving the disk drive enclosure. The rack mount has a support mechanism having edges shaped to engage an interlock on the disk drive enclosure to guide the disk drive enclosure into the bay. One or more spring loaded blocks, shaped to engage the interlock on the disk drive enclosure, permit the interlock to pass the blocks in a first direction and prohibit passage of the interlock in a second direction opposite the first direction. A user-operable member is constructed to move the spring loaded block to permit passage of the interlock in the second direction to permit removal of the disk drive enclosure from the rack mount.

In other aspects, the printed circuit board connector, and its various embodiments, are combined with the heat and noise reduction techniques. In another aspect, the mechanical interlocks for making and stacking the enclosures and its various embodiments are combined with the heat and noise reduction techniques. The heat and noise reduction techniques also may be used in combination with both the printed circuit board connector and the mechanical interlocks for stacking and racking the enclosures.

DETAILED DESCRIPTION

The following detailed description should be read in conjunction with the attached drawing in which similar reference numbers indicate similar structures.

Noise is reduced in a disk drive enclosure by using vibration damping materials on the inside surface of the enclosure. These materials and their placement on the inside surface of the enclosure reduce noise without thermally insulating the disk drive. A temperature controlled fan may be used to remove heat by convection while generating a minimum amount of noise. One embodiment of an enclosure with such noise and heat reduction will be first described in connection with FIGS. 1–6.

Figure 1:
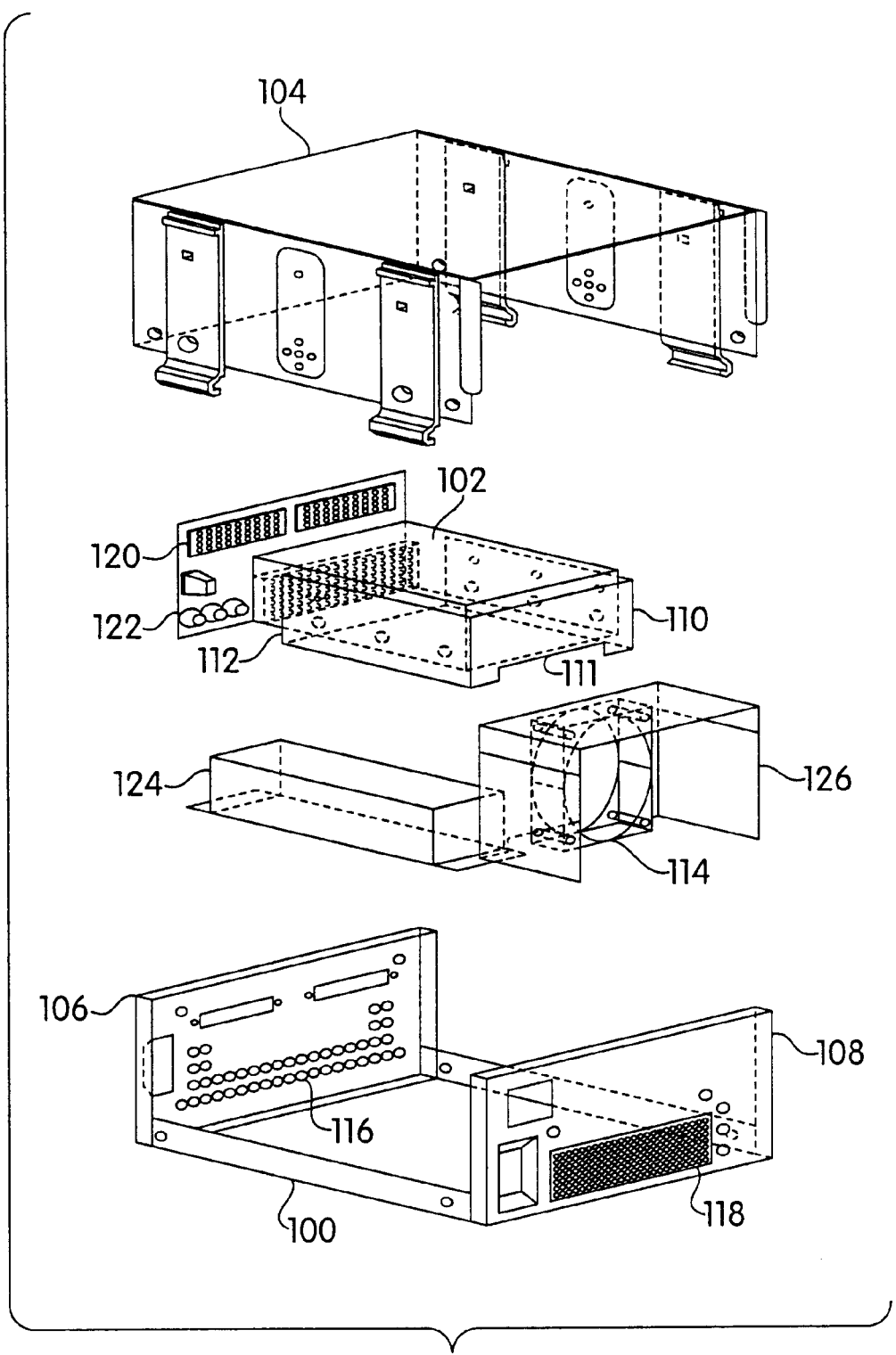
FIG. 1 is an exploded perspective view of a disk drive in an enclosure.

FIG. 1 is an exploded perspective view of a disk drive enclosure in one embodiment. The enclosure has a housing which, in this embodiment, is in four pieces. The housing pieces may be made of any material that is sufficiently hard and impact resistant for the environment in which the enclosure is used. Example materials include sheet metal, such as aluminum or steel, or hard plastic. The housing includes a base 100. A top portion 104 formed in "c" shape connects to the base 100. A front 108 and back 106 complete the enclosure. The base 100, front 108 and back 106 may be one piece. The front 108 has an air inlet 118. Back 106 has an air outlet 116.

A disk drive 102 is connected to the base 100 through a bracket 111 that has mounts 110 and 112. The bracket 111 is attached to the base 100. A power supply 124 also is mounted to the base 100 and also is a source of heat in the enclosure. The disk drive produces heat and noise, which are generally related to the power consumption and revolutions per minute of the disk drive motor. The disk drive 102 may be, for example, a Cheetah 9 or Cheetah 18 disk drive from Seagate Technology, Inc., of Scotts Valley, Calif. Such a disk drive complies with the small computer systems interface (SCSI) standard, and uses a low voltage differential (LVD) signal. This disk drive has a capacity of 9 to 18 gigabytes (GB) and a rotation speed of 7200 to 10000 revolutions per minute. It should be understood that many other types of disk drive may be used, and the invention is not limited to the type of interconnect, capacity of the disk drive, or other characteristics of the disk drive.

The base 100, when made of heat conducting material such as metal, acts a heat sink for the disk drive. In particular, the two mounting bracket 111 that connects to the disk drive at opposite ends along the sides of the disk drive through mounts 110 and 112 dissipates heat from the disk drive by conduction to the enclosure.

Heat also may be dissipated by convection, which should be used because integrated circuits within the disk drive often do not have a heat conduction path from the circuit to the housing of the disk drive itself. Heat convection is provided by a fan 114 which is shown located at the front 108 of the enclosure, between the disk drive 102 and the front 108 of the enclosure. The fan 114 also is mounted to the base 100 of the enclosure. To minimize the amount of noise produced by the fan while maximizing air flow, the fan should be selected so that its size is the maximum allowable to fit within the enclosure. Using a ball-bearing type fan or brushless DC motor also minimizes the amount of noise generated by the fan, reduces power consumption and increases reliability. A fan that meets these characteristics is available from Comair Rotron of San Ysidro, Calif., under the product name Flight 60 LT. This fan is rated at 23.2 CFM at 12 volts. It should be understood that the invention is not limited to the use of a particular fan, fan dimensions, fan type, or fan specifications.

The fan motor rotates about an axis to move blades that in turn cause air to flow. The direction of rotation and the orientation of the blades controls the direction of airflow. The fan may be positioned to draw air through an inlet, over the disk drive, through the fan and out an outlet in the enclosure. Alternatively, the fan may draw air through an inlet, through the fan, over the disk drive and out the outlet in the enclosure. In the former configuration, the temperature sensor should be placed between the disk drive and the fan. In that latter configuration, the temperature sensors should be placed between the disk drive and the outlet. In general, the temperature sensor should be adjacent to the disk drive and adjacent to the side of the disk drive that is closest to the outlet.

The fan is controlled by a circuit (not shown) that may be mounted on a printed circuit board 120. The fan may be controlled according to temperature sensed adjacent the disk drive. A temperature sensor 122, such as a thermistor, is mounted adjacent the disk drive and in the path of airflow that comes in a direction from the disk drive, rather than towards the disk drive. The fan may be controlled to operate at a lower speed at lower temperatures, thus reducing the amount of noise generated by the fan. In this manner, the temperature sensor detects the approximate ambient temperature of the disk drive.

The control circuit for the fan will be described in more detail below in connection with FIGS. 2–6.

Figure 2:
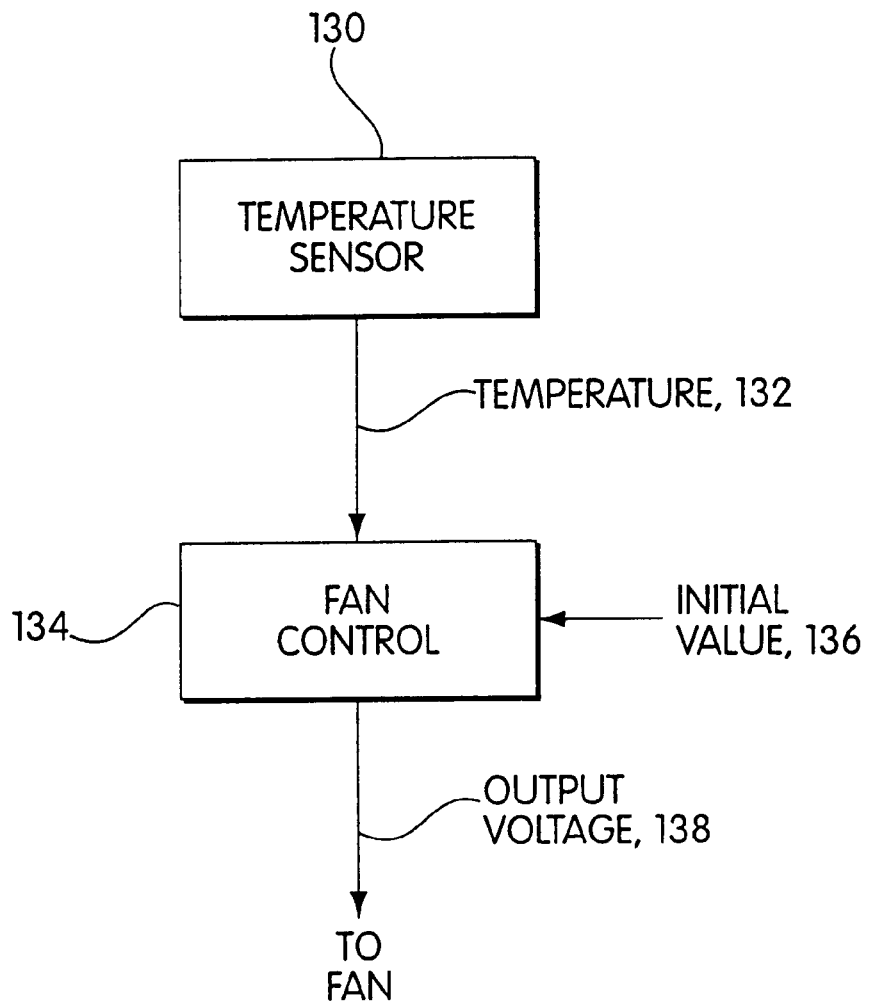
FIG. 2 is a block diagram of thermal sensing and fan control circuit.

Referring now to FIG. 2, the temperature sensing control circuit for the fan will now be described. FIG. 2 is a block diagram of such a circuit. The temperature sensor 130 reacts to ambient temperature to generate an output signal 132 that is a function of the detected temperature. Different temperature sensors are selected for temperatures in different ranges. Ideally, the temperature sensor should have an operating range between 10° C. and 70° C. In the embodiment described below, a thermistor is used as the temperature sensor.

The output of the temperature sensor is received by an input to a voltage control circuit 134. The voltage control circuit 134 also has an input for receiving a certain minimum value 136, indicative of a minimum voltage which it should provide as an output. The output 138 of the voltage control circuit is dependent upon the specified minimum voltage and the temperature sensed by the temperature sensor. The output of the voltage control circuit is then applied to the fan.

Figure 3:
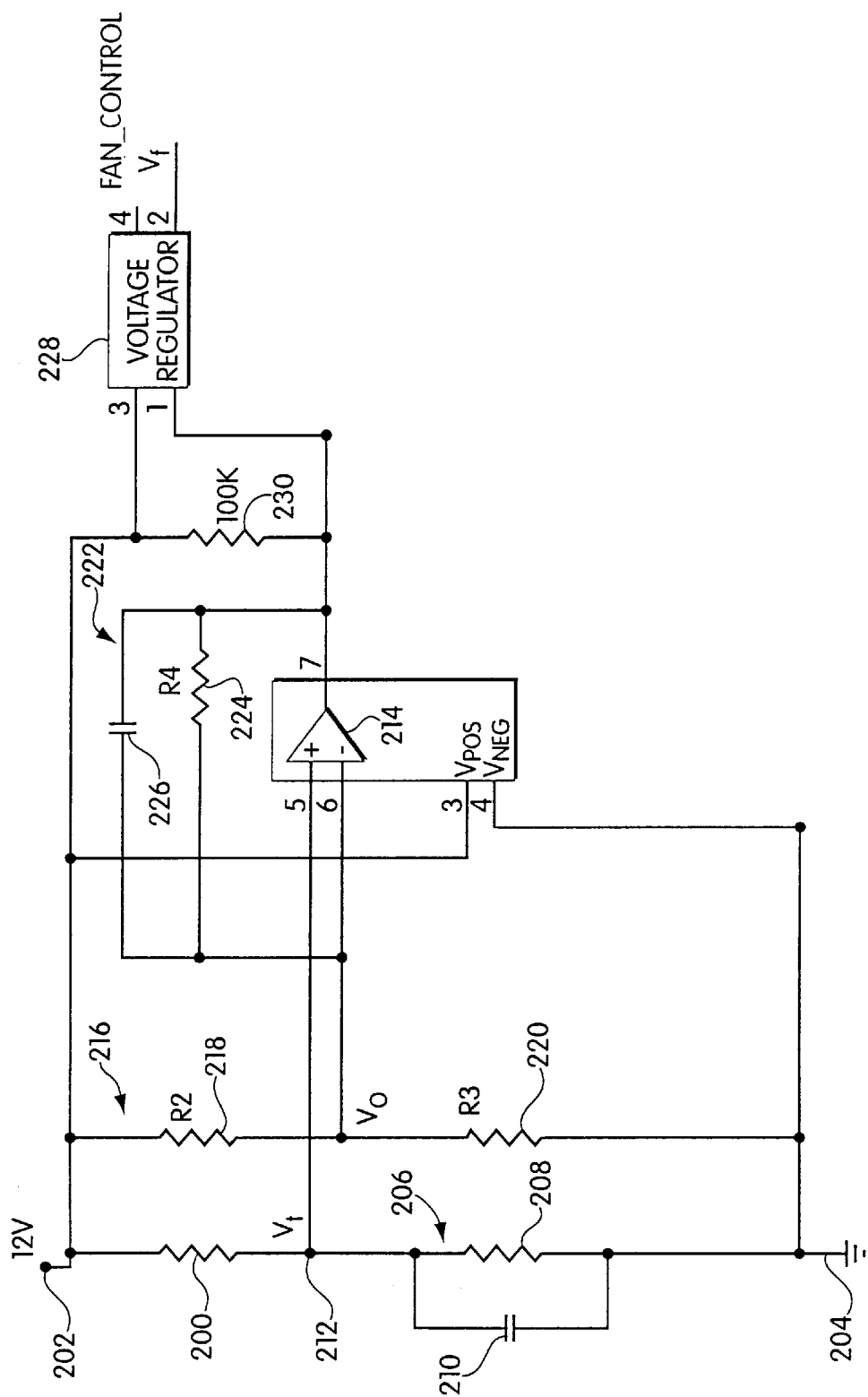
FIG. 3 is a more detailed circuit diagram of one embodiment of the thermal sensing and fan control circuit of FIG. 2.

Referring now to FIG. 3, a detailed circuit diagram of one embodiment of the temperature control signal of FIG. 2 will now be described. In FIG. 3, the temperature sensor is a thermistor 200, or thermally sensitive resistor, which is connected to a source voltage 202 (e.g., 12 volts). An example thermistor is a negative temperature coefficient (NTC) thermistor Part No. LM5001-5, available from Dale Electronics, Inc. of Columbus, Nebr., which has a nominal impedance of about 5000 (5K) ohms, but which varies from 8.375K ohms to 0.5K ohms over a temperature range of 10° C. to 70° C. A positive temperature coefficient (PTC) thermistor also could be used, with appropriate changes to the control circuit. It should be understood that the invention is not limited to any particular thermistor.

The thermistor is connected to a common voltage 204 through an RC circuit 206 having a resistor 208 (e.g. 100K ohms) and a capacitor 210 (e.g., 0.1 $\mu$F) connected electrically in parallel. The voltage (Vt) at node 212 between thermistor 200 and RC circuit 206 is applied to the positive input of an operational amplifier 214. Example commercially available operational amplifiers include the TL082, LM358 or LM1558 operational amplifiers available from several sources, such as National Semiconductor Corporation of Santa Clara, Calif. The negative input of the operational amplifier is the voltage (Vo) from a voltage divider 216, having two resistors 218 (with impedance R2) and 220 (with impedance R3) connected in serial between the source voltage 202 and common voltage 204. A feedback connection from the output of the operational amplifier 214 to its negative terminal is provided by an RC circuit 222 including a resistor 224 (with impedance R4) and capacitor 226 (e.g., 0.1 μF) connected electrically in parallel. The output of operational amplifier 214 also is connected to a voltage regulator 228. A suitable voltage regulator is Part No. LM 1117T, available from National Semiconductor Corporation of Santa Clara, Calif., or other sources. The input of the voltage regulator 228 is connected to the source voltage 202 and a terminal of a resistor 230 (e.g., 100K ohms) connected between the output of operational amplifier 214 and the source voltage 202. Its output voltage (Vf) is provided to the fan.

In the circuit shown in FIG. 3, the output voltage Vf of the voltage regulator is described by the following equations:

$$Vf=(Vt-Vo)Av+1.25V$$

$$Av=1+(R4/((R2+R3)/R2R3))$$

Given the temperature-to-voltage characteristics of the thermistor, the voltage Vo may be set by selecting impedances for resistors R2, R3 and R4 such that the desired output voltage Vf is obtained from the voltage regulator 228. The maximum output voltage Vf should be set to occur at a temperature lower than the maximum temperature specified for reliable operation of the disk drive.

Figure 4:
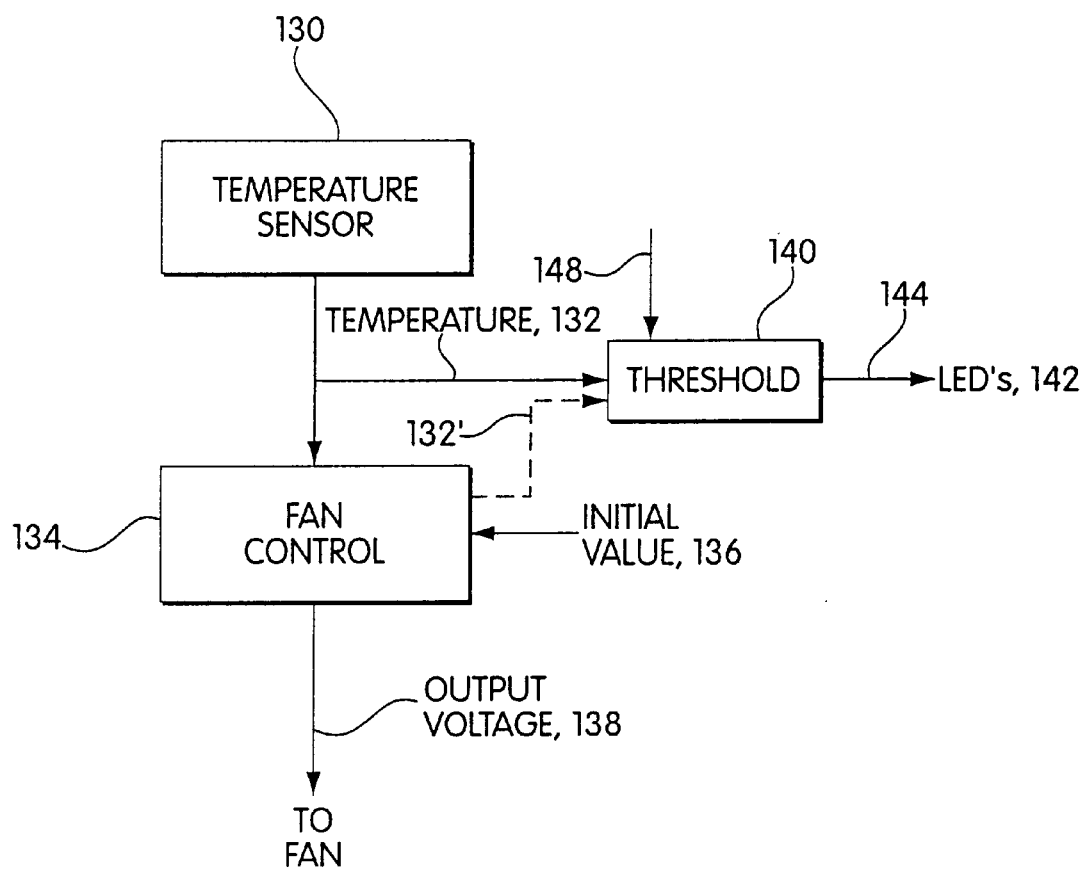
FIG. 4 is a block diagram of the circuit of FIG. 2 further including a temperature indicator.

FIG. 4 illustrates another embodiment of the control circuit for the fan that also provides a high temperature indicator signal 144. This signal may be used to signal an alarm to a user or to the computer system. For example, the signal may be used to illuminate a light emitting diode (LED) 142 on the enclosure to indicate that the recommended operating temperature of the disk drive has been exceeded. The high temperature indicator signal is generated as a function of the temperature signal 132 or 132' by a threshold circuit 140. The temperature signal may come from the thermistor as indicated at 132 or from the fan control circuit as indicated at 132'. The threshold circuit 140 receives a signal 148 indicative of the threshold temperature indicate the operating range of the disk drive.

Figure 5:
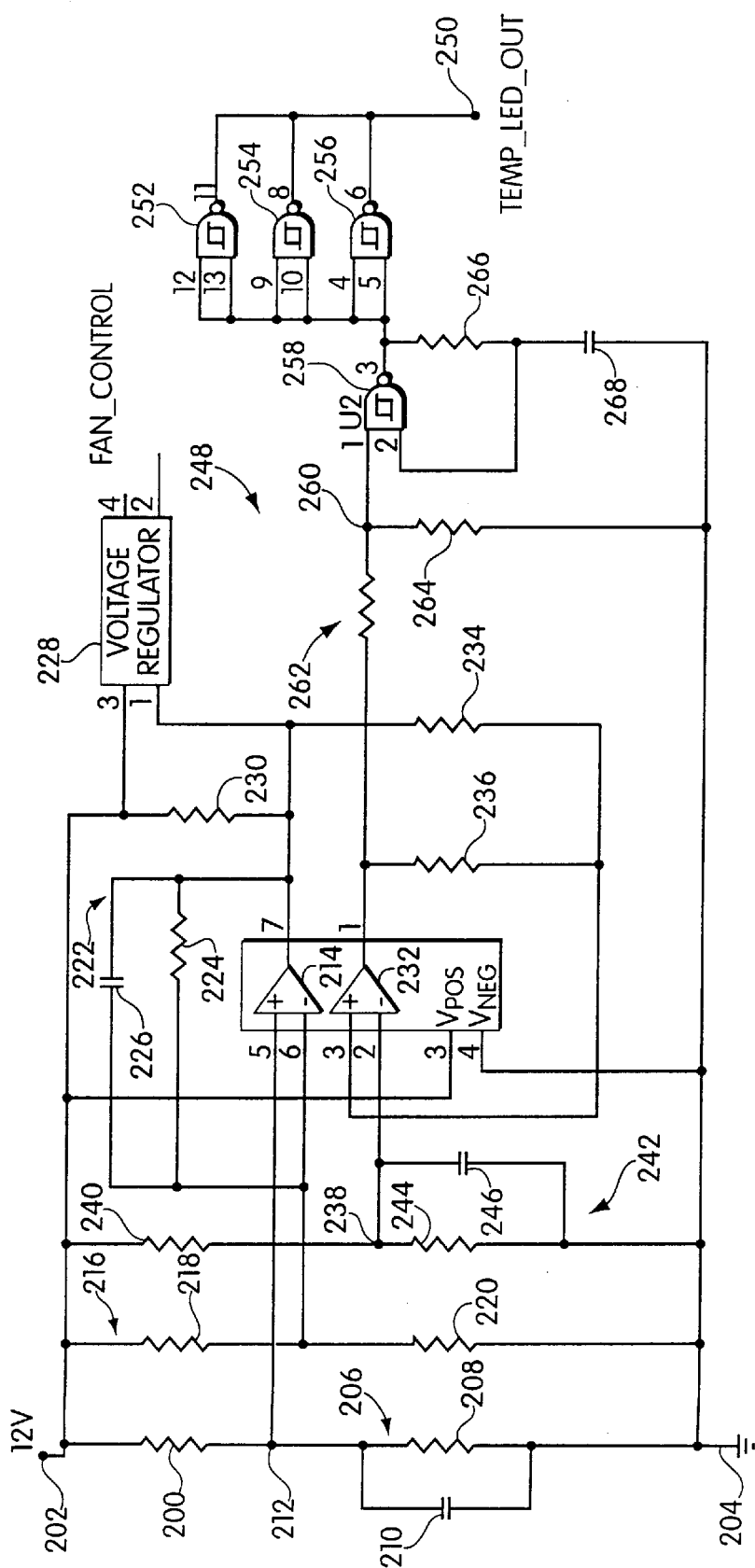
FIG. 5 is a more detailed circuit diagram of the circuit of FIG. 4.

Referring now to FIG. 5, a detailed circuit diagram of one embodiment of the temperature control signal of FIG. 4 will now be described. FIG. 5 adds to the circuit of FIG. 3 a second operation amplifier 232 with a positive input that connects to the output of operational amplifier 214 through resistor 234 and to the output of operational amplifier 232 through resistor 236, to provide hysteresis. The negative input of operational amplifier 232 is connected to node 238 between a resistor 240 and RC circuit 242 connected in serial between source 202 and common 204. The RC circuit 242 includes resistor 244 and capacitor 246 (e.g., 0.1 μF). The output of operational amplifier 232 controls a light emitting diode (not shown) through a control circuit 248 which provides an LED output 250. The control circuit 248 includes three NAND Schmitt triggers 252, 254 and 256 of which the combined outputs provide the current to drive the output LED 250. The input to the Schmitt triggers 252 through 256 is provided by the output of a NAND Schmitt trigger 258, which is configured to be an oscillator. The first input of Schmitt trigger 258 is connected to a node 260 between resistors 262 and 264 connected in serial between the output of operational amplifier 232 and common 204, which implements a voltage divider. The second input of Schmitt trigger 258 is provided by a feedback circuit through resistor 266, and is also connected to common 204 via capacitor 268 (e.g., 0.33 μF). The resistors 234, 236, 240, 244, 260, 264 and 266 may have an impedance, for example of 100K ohms.

Figure 6:
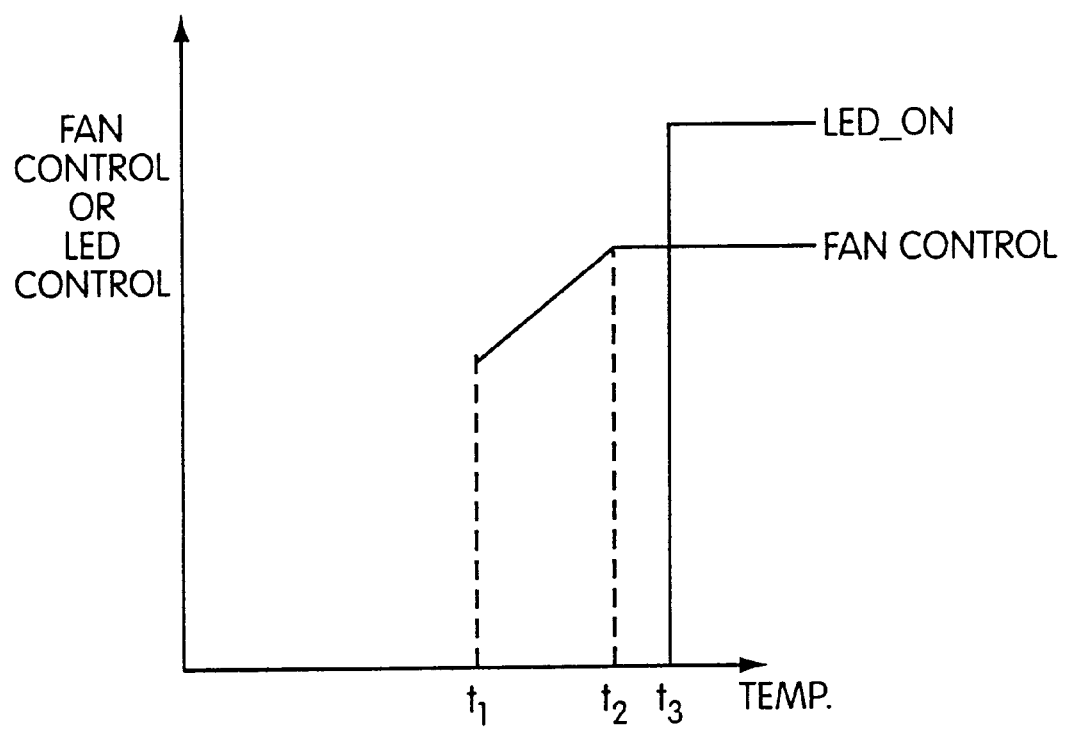
FIG. 6 is a graph of a typical transfer function for the circuits of FIG. 3 and 5.

Characteristics of the circuits shown in FIGS. 3 and 5 are illustrated by the graph of FIG. 6. As temperature of the disk drive increases up to temperature t1, the fan is off. As the temperature increases above t1, the fan is turned on, but at a low speed. Ultimately, the top speed of the fan is reached by temperature t2. If the ambient temperature near the disk drive continues to increase, the temperature ultimately reaches temperature t3 that indicates the limit of the desired operating range of the disk drive. At this temperature, the threshold circuit 140 in FIG. 4 generated the high temperature signal. Using such a fan control circuit, the fan is used on when the detected ambient temperature is such that heat should be dissipated. If the fan is operating at its maximum speed and the temperature continues to increase, the user or computer system is alerted to the excessive temperature. The temperatures t1, t2 and t3 vary with the fan and disk drive used. As a result, the selection of various components for use in the circuits shown in FIGS. 3 and 5 is application dependent.

Having now described the heat dissipation in the enclosure, noise reduction will now be described again in reference to FIG. 1. Noise within the disk drive enclosure is created by vibrations from the disk drive and fan. By using a temperature controlled fan, and the largest fan that fits in the enclosure, the amount of noise produced by the fan is minimized. The vibrations from the disk drive and fan propagate through the walls of the enclosure itself, the disk drive and fan to create audible sound, typically in the range of 1 kHz to 4 kHz.

The mechanical vibrations in the walls of the enclosure may be reduced by applying a vibration damping material to the inside surface of the housing. The vibration damping material ideally covers as much of the surface area as practical, and any mounting brackets of the disk drive and fan. At a minimum, the material is applied to the inside surface of the base and top of the housing. The vibration damping material also may be applied to the front and back of the housing. By using a vibration damping material applied to the housing, the disk drive is not insulated; heat still may be dissipated from the disk drive by convection. Vibrational damping materials also may be used in any connectors between the fan and the base of the enclosure.

In a vibration damping material, vibrational energy is converted into heat rather than sound. An example vibration damping material is a styrene-butyadine-rubber based mastic with an aluminum constraining layer. Such a material is advantageous because it is both thin and effective at reducing noise. One example of such a material is a material sold under the trademark Dynamat Super by Dynamic Control of Hamilton, Ohio. This material has a pressure sensitive adhesive on one side. Because it may be die-cut and easily installed, it is cost-effective to use. This material has a thickness of about 0.060 inches. This material has an acoustic loss factor of about 0.10 to 1.5 depending on the ambient temperature and frequency range of the vibrations. It should be understood that the invention is not limited to any particular vibration damping material. Other damping materials having similar noise reduction properties also may be used.

Reducing noise from sound waves in the air in the enclosure is more difficult because the disk drive enclosure has air inlets 118 and outlets 116 to permit heat convection to dissipate heat from the enclosure. In particular, the fan draws air into and forces air out of the disk drive enclosure. In order to reduce sound waves exiting the enclosure through the outlet, the printed circuit board 122 is placed in a vertical orientation as shown in FIG. 1. Alternatively, a baffle also may be placed between the outlet and the disk drive if the printed circuit board is placed in a horizontal orientation. Also, in order to reduce sound waves from the fan, a muffler 126 (shown in FIG. 1) may be used. The area between the baffle and the fan may be filled with sound absorbing material, such as vibration damping material or foam, to reduce noise from the fan.

Having now described noise and heat reduction, other improvements to the enclosure will now be described.

The connection between the disk drive and the external connector of the disk drive enclosure is improved by using a printed circuit board instead of a cable. In particular, because a printed circuit board has a fixed location and fixed layout, variability among disk drive enclosures is minimized. Also, errors in manufacturing of the disk drive enclosure are reduced. Such a connector is described in connection with FIGS. 7 and 8A–E.

Figure 7:
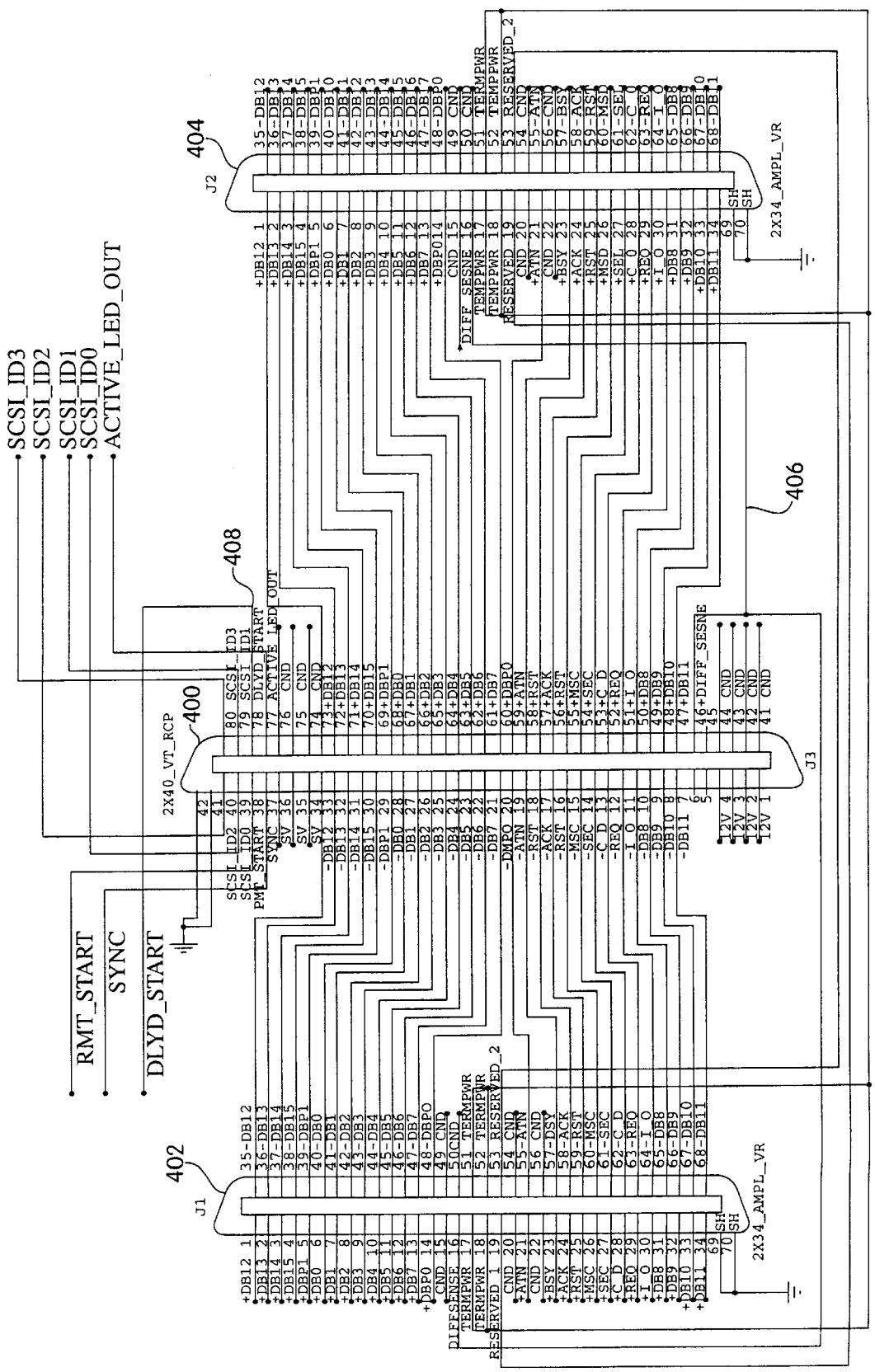
FIG. 7 is a circuit diagram of one embodiment of the printed circuit board connector.

Referring now to FIG. 7, a circuit diagram for a printed circuit board connector will now be described. The disk drive has a connector to which a connector 400 attaches. The disk drive enclosure has two connectors to which connectors 402 and 404 attach. The connectors 400, 402 and 404 are mounted on the printed circuit board. Connector 402 is an input; connector 404 is an output. In a configuration such as shown in FIG. 7, several SCSI disk drive devices may be daisy chained together.

The actual signals provided by the disk drive which pass through connectors 402 and 404 and defined by the SCSI standard. In this embodiment the signals are low voltage differential (LVD) signals. The eighteen differential data signals (thirty-six signal lines) are known as DB0- 15 (data bus) and DBP0-P 1 (data bus parity). There are also nine differential control signals labeled as: ATN (attention), BSY (bus is busy), ACK (acknowledge), RST (reset), MSG (message), SEL (select), C±D (control or data), REQ (request), and I±O (in/out).

On connectors 402 and 404, the ATN (attention) signals are separated from other signals by ground pins on the connector. Connectors 400, 402 and 404 also have a differential sense signal which is interconnected among the connectors. Similarly, reserved signal lines and termination power signal lines also are interconnected between connectors 402 and 404. Connector 400 also provides an active signal 408 that may be provided to a light emitting diode on the face of the disk drive enclosure to signal activity of the disk drive. SCSI identifier signals (SCSI±ID0–3) also may be routed on the circuit board to a different connector that provides signals from a SCSI identification switch, such as a push button rotary switch mounted on the front of the disk drive enclosure, indicating these identifiers to the disk drive. The other signals RMT±START, DLYD±START and SYNC need not be used.

Given the circuit diagram for the connectors as shown in FIG. 7, these circuits may be implemented using a printed circuit board instead of a cable, which provides various benefits. The printed circuit board provides a more definite connection between the disk drive and the enclosure. Also, the printed circuit board reduces the variability among devices that would otherwise be present if cables were used.

When routing this circuit on a printed circuit board, several constraints are applied to the traces to maximize performance. These constraints are as follows:

1) a thick trace is used for the termination power signals;
2) the traces for the ACK (acknowledge) and REQ (request) signals are the same length;
3) the impedance of the traces for the ACK (acknowledge) and REQ (request) signals is 90±6 Ohms; and
4) the impedance of the remaining traces is 90±10 Ohms.

Figure 8A:
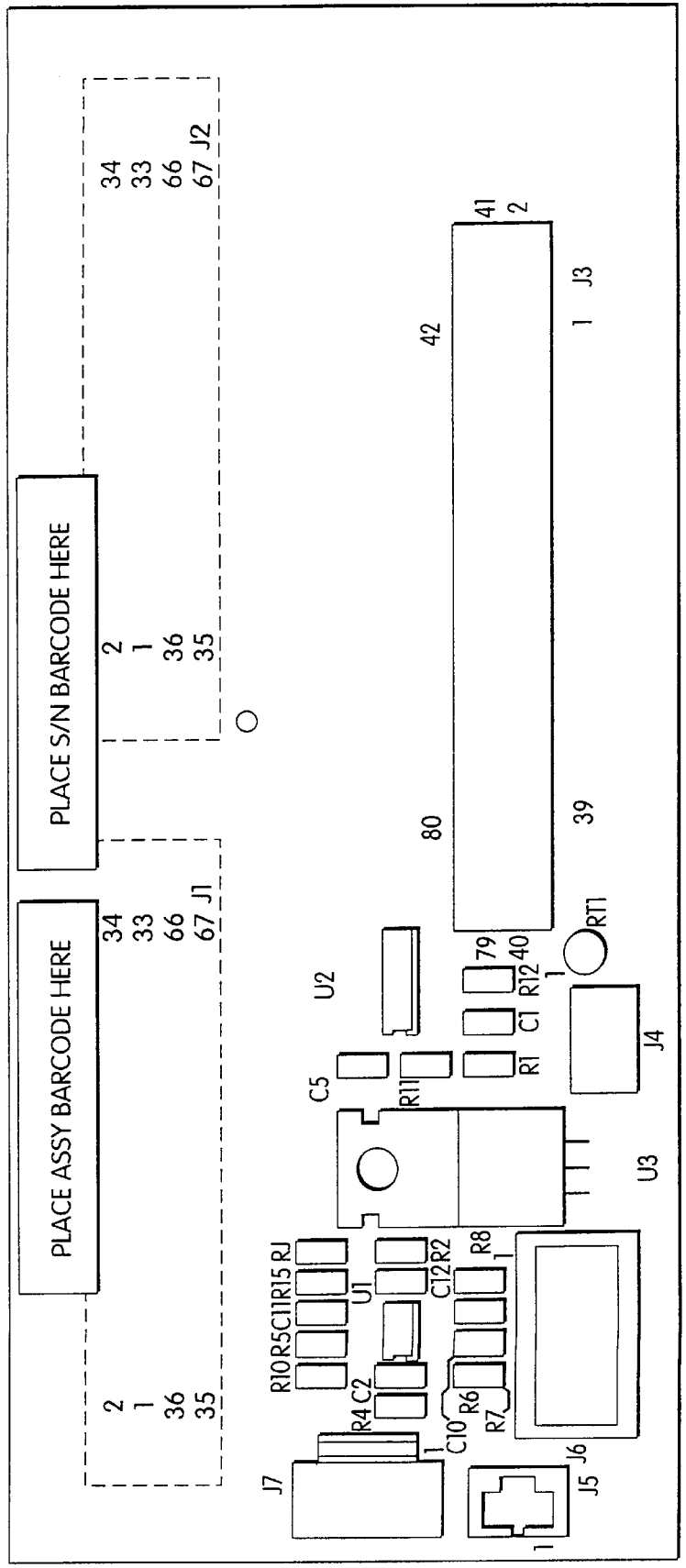
FIGS. 8A–E are a layout diagram for one embodiment of the printed circuit board connector of FIG. 7 and including the control circuit of FIG. 6.
Figure 8B:
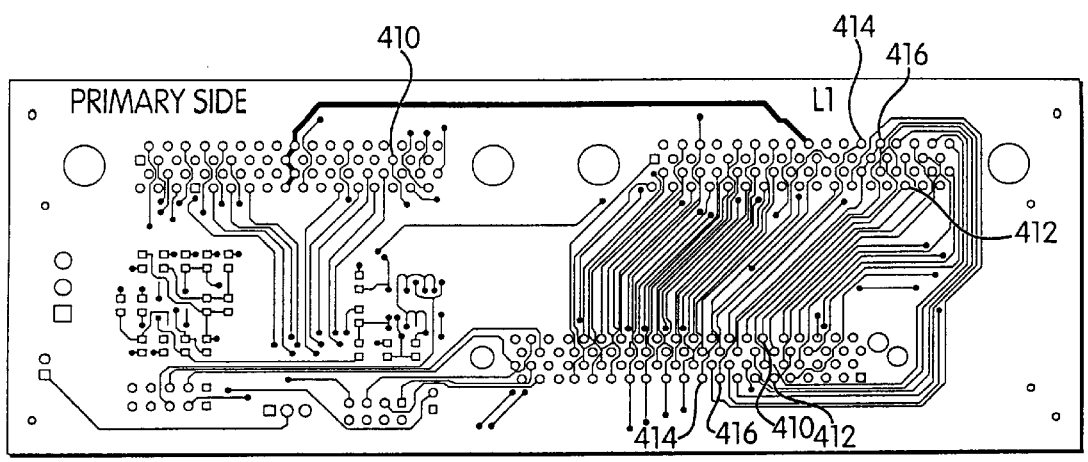
Figure 8C:
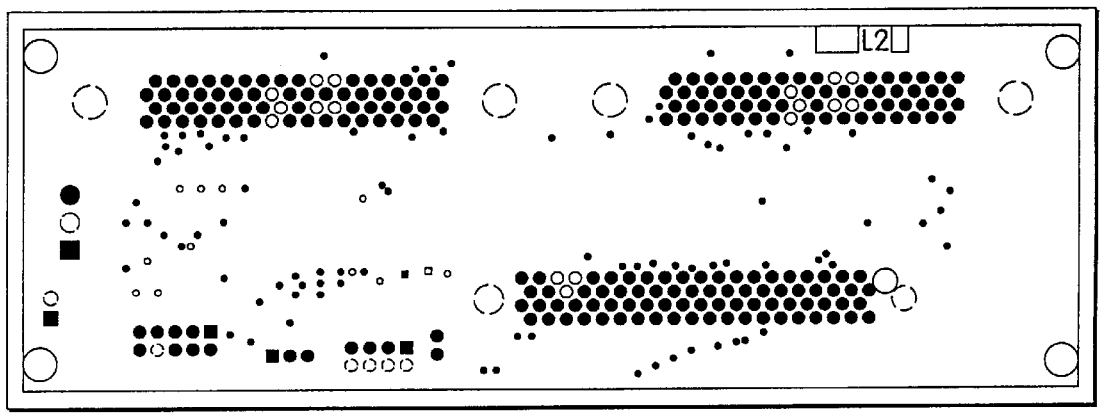
Figure 8D:
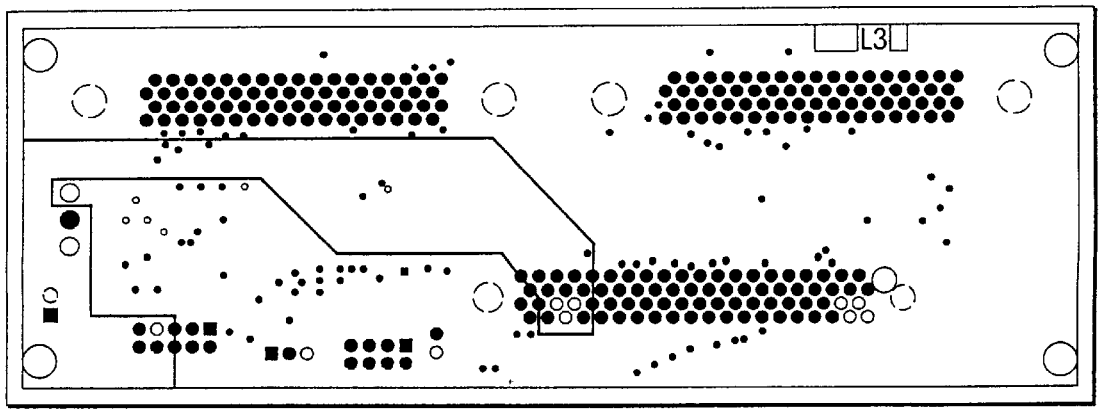
Figure 8E:
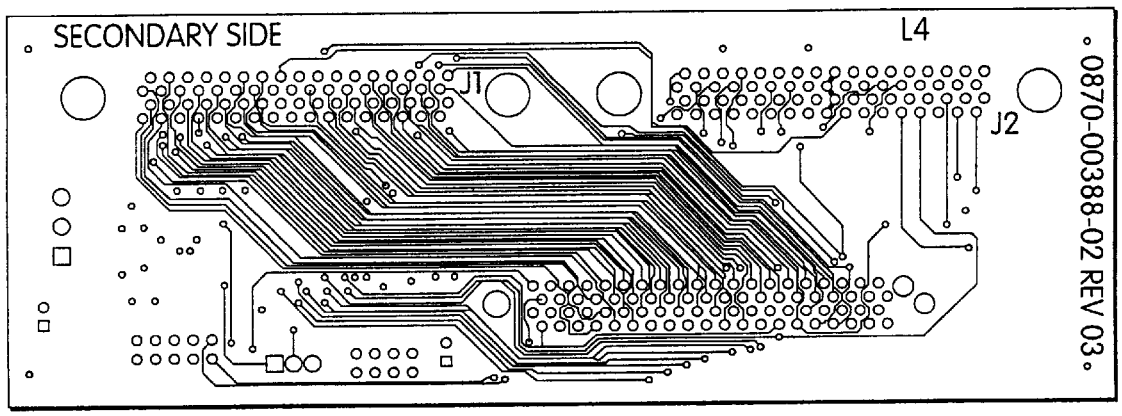

One embodiment of the printed circuit board on which both the circuit of FIG. 5 and the circuit of FIG. 7 are provided, is shown in FIGS. 8A–8E. FIG. 8A illustrates the silkscreen on the primary side of the board and indicates the placement of the electronic components of FIG. 5, other connectors, and the connectors of FIG. 7. FIG. 8B illustrates a first layer of traces. The traces for the acknowledge and request signals are illustrated by reference to the connector pins for these signals. In particular, the +REQ signal is on pin 29 of the 68 pin connectors and pin 52 of the 80 pin connector, as indicated at 410. The –REQ signal is on pin 63 of the 68 pin connectors and pin 12 of the 80 pin connector, as indicated at 412. The +ACK signal is on pin 24 of the 68 pin connectors and pin 57 of the 80 pin connector, as indicated at 414. The –ACK signal is on pin 58 of the 68 pin connectors and pin 17 of the 80 pin connector, as indicated at 416. FIG. 8C illustrates the ground plane which is the second layer. FIG. 8D illustrates the power plane which is the third layer. FIG. 8E illustrates a second layer of traces, which is the fourth layer. The printed circuit board has a set of through holes for each connector 400', 402', and 404' that are mounted to the printed circuit board. The actual location of these connectors on a printed circuit board depends on the location of the disk drive connector and the connectors on the enclosure. The embodiment shown in FIGS. 8A–E is for a printed circuit board that is placed horizontally within the disk drive enclosure. The three connectors are mounted on the same surface of the printed circuit board. In an alternative embodiment, the printed circuit is placed vertically within the enclosure. In this embodiment, the connector to the disk drive is mounted on the surface of the printed circuit board opposite the connectors to the enclosure.

By using the printed circuit board as a connector, other circuits inside the disk drive enclosure also may be mounted on the printed circuit board. In particular, the temperature sensor may be mounted on the printed circuit board. The fan control circuit also may be mounted on the printed circuit board.

Having now described the printed circuit board connector, features of the enclosure that permit stacking of multiple enclosures, or placement of the enclosure in a rack, will now be described in connection with FIGS. 9–15. To facilitate the use of the disk drive in a stripe set, the disk drive enclosure may have a set of mechanical interlocks that permit the enclosures to be stacked vertically in either an unlocked or a locked formation. The locked configuration may be made permanent using an additional locking mechanism. These mechanical interlocks also may be used to support the enclosure on a desktop. The mechanical interlocks also may be constructed so that they can slide on a rail, permitting the enclosure to be used in a rack mount. The rack mount also may be provided with a quick release mechanism that interacts with the mechanical interlocks to hold the disk drive enclosure in the rack mount.

Figure 9:
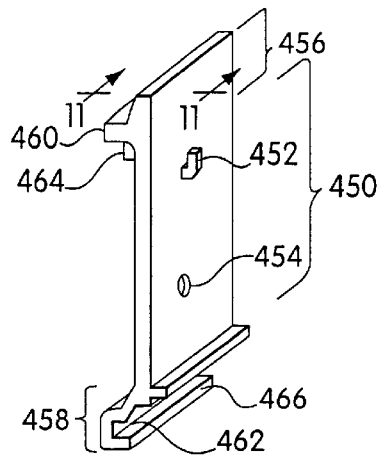
FIG. 9 is a perspective view of a mechanical interlock for stacking enclosures.
Figure 10:
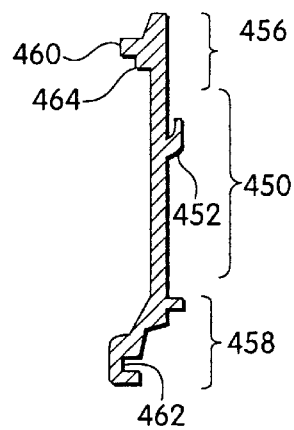
FIG. 10 is a side elevational view of a mechanical interlock for stacking enclosures.
Figure 11:
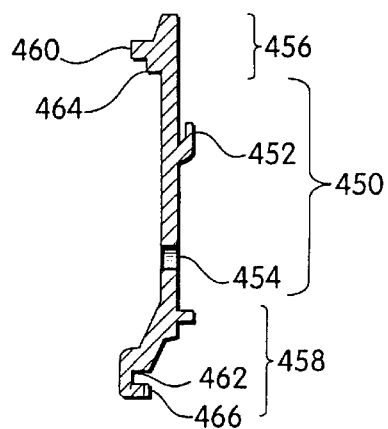
FIG. 11 is a cross-sectional side view of a mechanical interlock for stacking enclosures.

Referring now to FIGS. 9–11, one embodiment of a mechanical interlock will now be described. Four of these mechanical interlocks are attached to the sides of the disk drive enclosure. The mechanical interlock has a portion 450 that is used to attach the mechanical interlock to the enclosure. In this embodiment, a hooked member 452 inserts into the disk drive enclosure and a hole 454 permits a screw to attach the mechanical interlock to the enclosure. The shape of the region 450 and the manner of attaching it to the enclosure are not significant to the present invention. The mechanical interlock connects two enclosures by mating the top portion 456 of one mechanical interlock with the bottom portion 458 of the other mechanical interlock. The top portion has a surface or shape 460 that is complementary to the surface or shape 462 of the bottom portion. The mechanical interlock may be made of any suitably strong material, such as a blend of 50% PVC and 50% ABS plastic.

In one configuration, the top portion has top face and the bottom portion has a bottom face such that the top face of the top portion of a first mechanical interlock supports the bottom face of the bottom portion of a second mechanical interlock when enclosures on which the first and second mechanical interlocks are attached are vertically aligned and stacked. This configuration provides an unlocked stack of disk drive enclosures.

Figure 12:
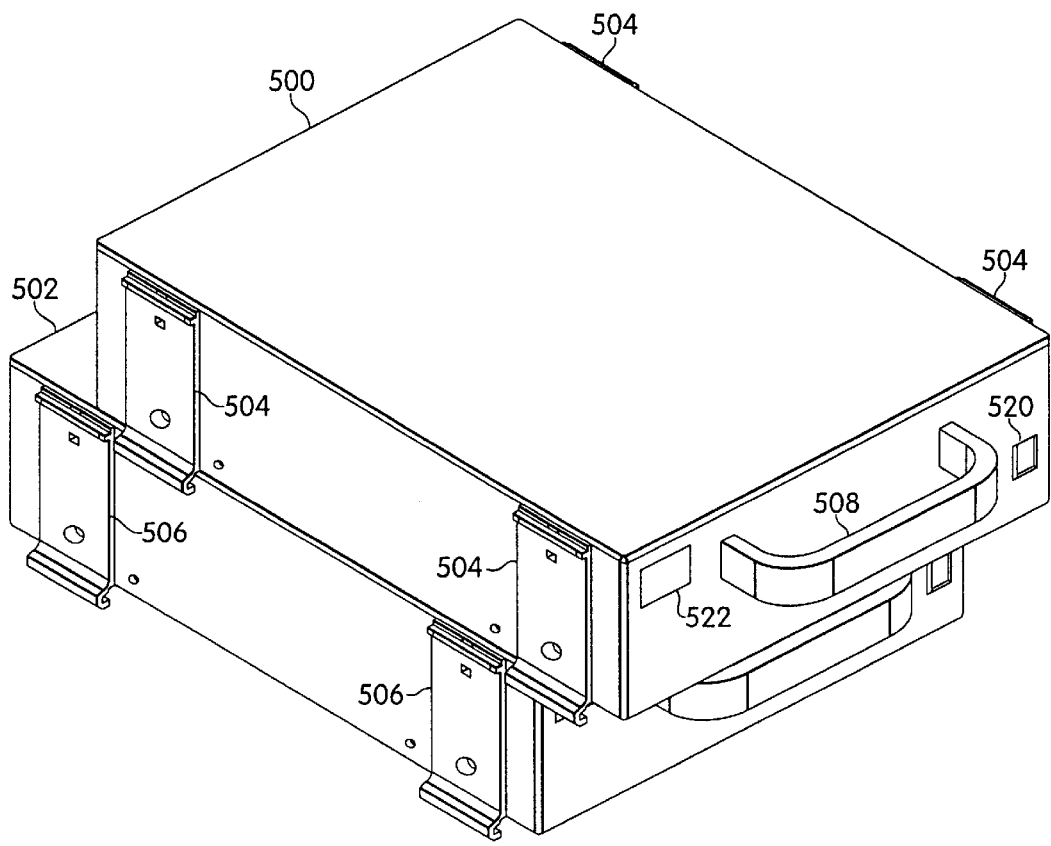
FIG. 12 is a perspective view of two unconnected drive enclosures.
Figure 13:
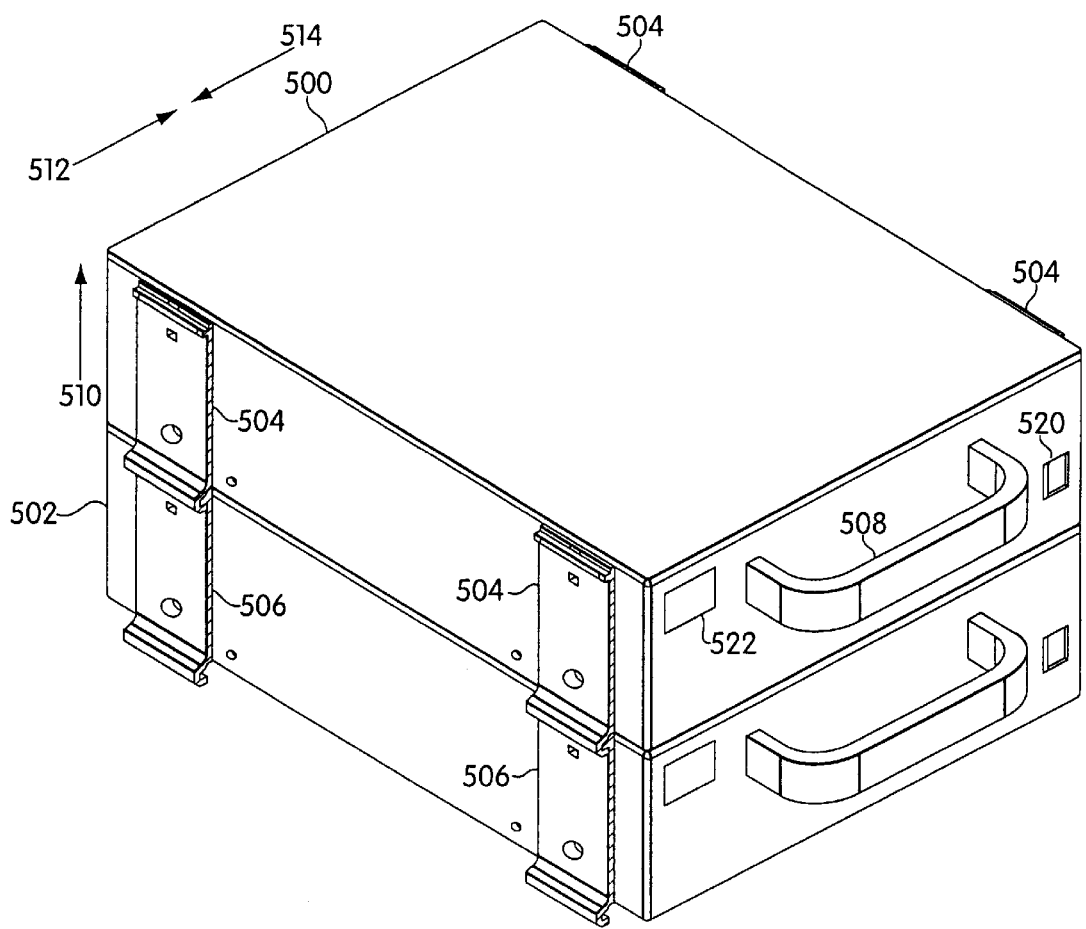
FIG. 13 is a perspective view of two connected drive enclosures.

The shapes on the mechanical interlock also permit a locked configuration. In particular the shapes of the mechanical interlock are such that the bottom portion 458 of one mechanical interlock and the top portion 456 of another mechanical interlock are slidably connectable in a first direction, such as shown in FIGS. 12 and 13. In FIG. 12, a first enclosure 500 is placed on top of a second enclosure 502. The mechanical interlocks 504 on the first enclosure engage with the mechanical interlocks 506 on the second enclosure when the first enclosure is slid on top of the second enclosure. When connected, as shown in FIG. 13, movement of the mechanical interlocks with respect to each other in a direction orthogonal to the direction of sliding is prohibited. In this embodiment, the shape 462 is a "c" shape whereas the shape 460 is a "-" shape. By using these shapes, movement in the vertical direction 510 is prohibited, thus connecting the enclosures on which these mechanical interlocks are mounted. Lateral movement in one direction 512 also is prohibited. With such mechanical interlocks on both sides of the enclosure, lateral movement in both directions 512 and 514 is limited.

As shown in FIG. 9 through 11, the mechanical interlock also may have a detent 464 on the top portion 456 that interacts with a complementary detent 466 in the bottom portion to maintain the connection between two mechanical interlocks. Any other mechanism may be used to maintain the connection between the two mechanical interlocks. For example, a piece attached to one enclosure may rotate and mate with a complementary piece on another enclosure. This rotated piece may be secured to the other enclosure, for example by using a screw.

Figure 14:
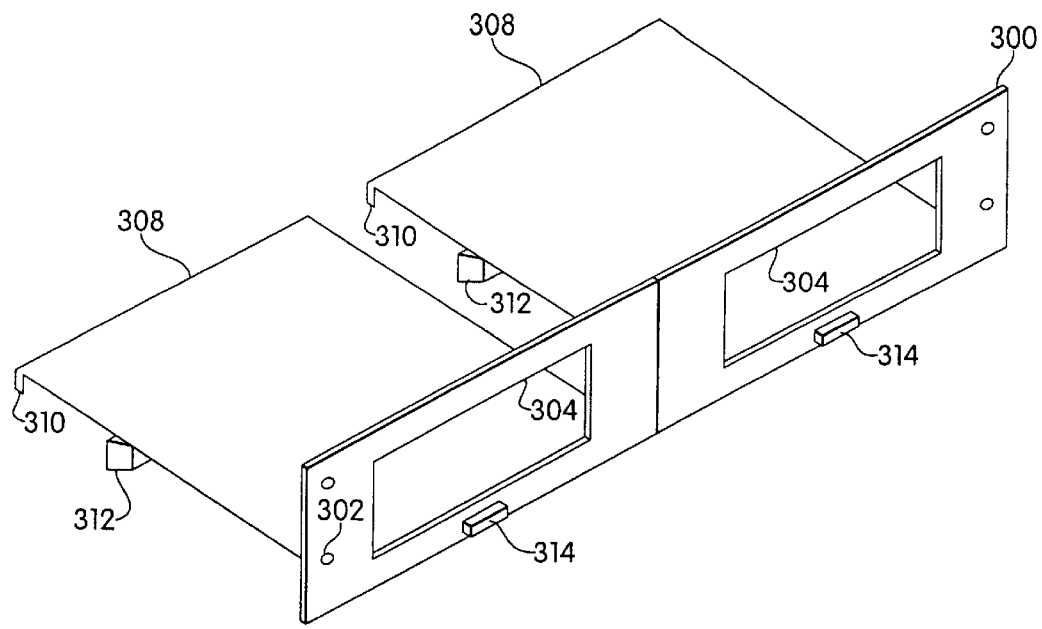
FIG. 14 is a perspective view of a rack for mounting an enclosure.
Figure 15:
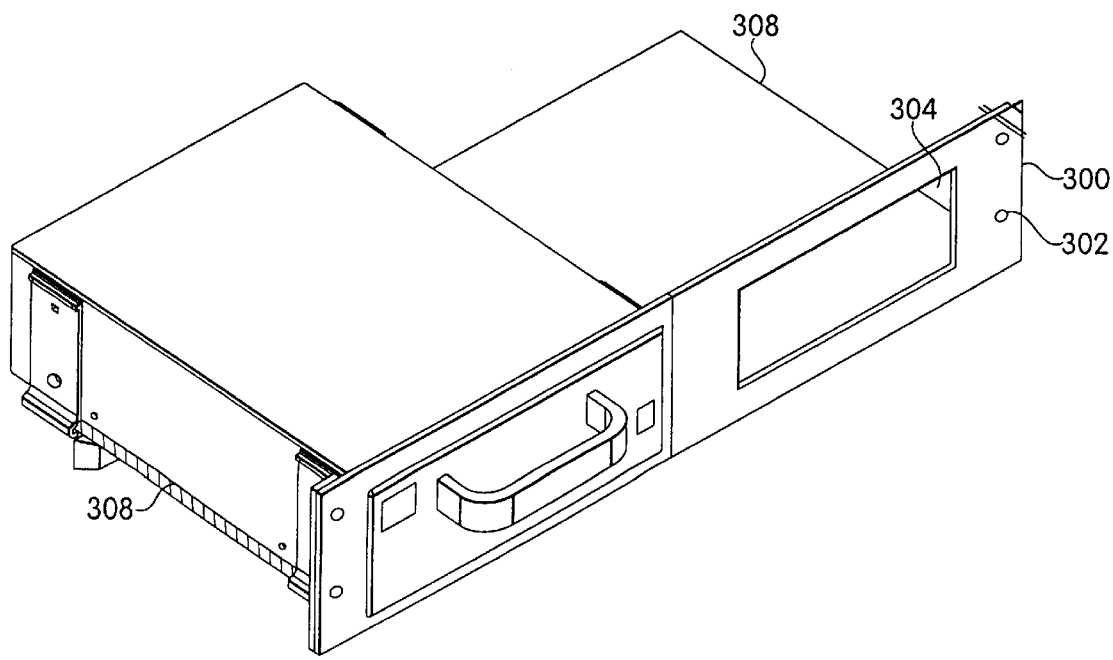
FIG. 15 is a perspective view of a rack with an enclosure mounted therein.

Also shown in FIGS. 12 and 13 are a handle 508, rotating counter 520 that may be used to provide the SCSI identifier signals to the disk drive and an LED display 522 to indicate the status of the disk drive. FIGS. 14 and 15 illustrate how the enclosure shown in FIGS. 12 and 13 also may be used in a rack configuration. A rack mount, shown in FIG. 14, has a faceplate 300 that can be attached to a rack by any suitable attachment through holes 302. One or more bays 304 receive an enclosure. The embodiment shown in FIGS. 14 and 15 accepts two drive enclosures independently. The enclosure is placed through openings in the faceplate into bays 304 so that the bottom portion of each mechanical interlock engages with the edge of a plate 308. Alternatively, two rails may be provided on the rack mount to engage the mechanical interlocks in order to support the sides of the enclosure. The plate or the rails may terminate with a detent 310 that prevents the enclosure from sliding off the end of the plate or rails. The enclosure as mounted in the rack mount is shown in FIG. 15. A quick release mechanism 312, operated using button 314 also may be provided.

Figure 16:
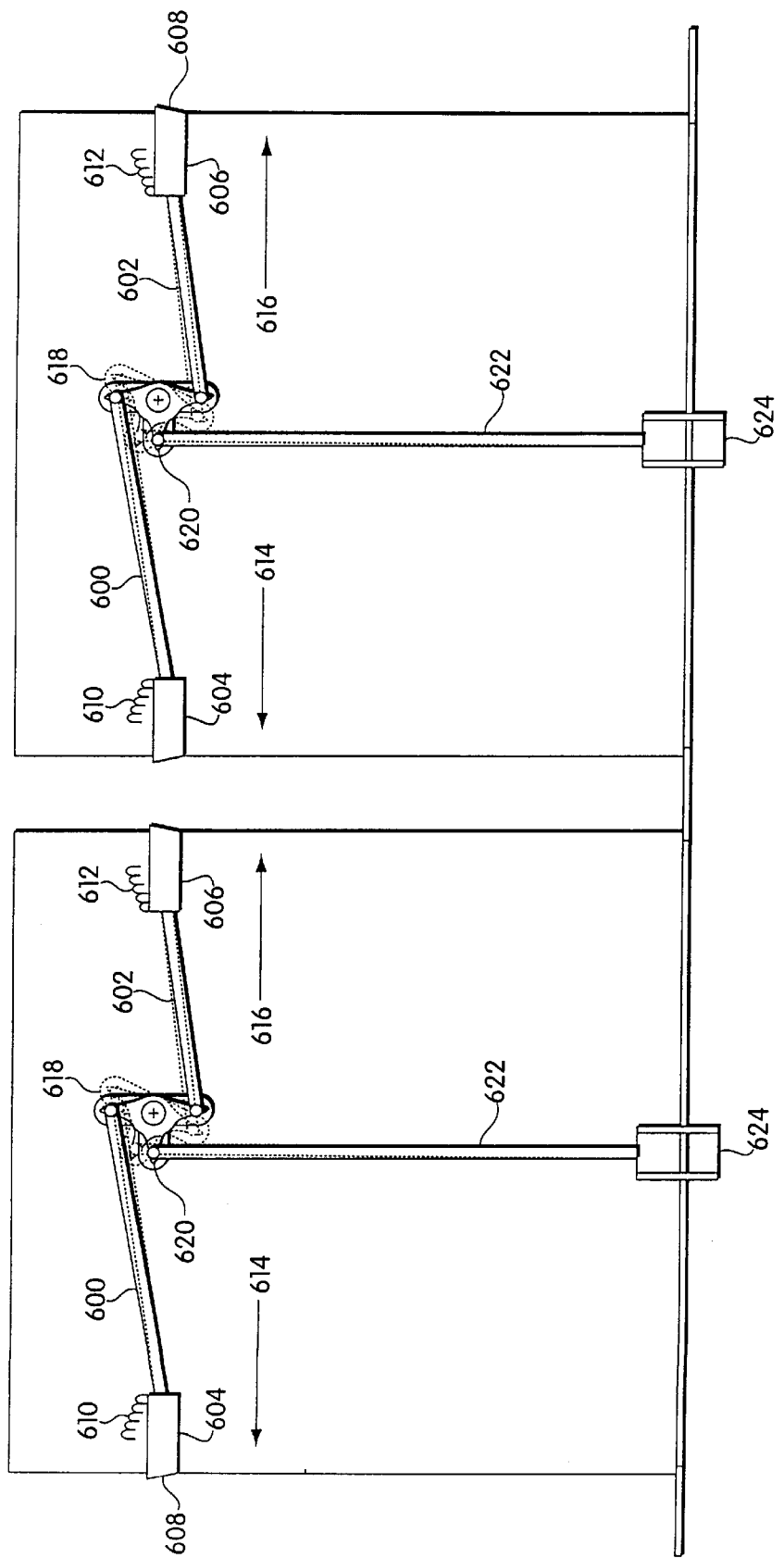
FIG. 16 is a top view of a mechanism permitting quick release of the enclosure from a rack.

The quick release mechanism is described in connection with FIG. 16, which is a bottom view of a rack mount, illustrating the quick release mechanism underneath the support or rails for the disk drive enclosure. The quick release mechanism includes two arms 600 and 602, each of which supports a corresponding block 604, 606 (also shown at 312 in FIG. 14 and 15). Each block (e.g., 604), has a sloped surface 608 that extends from the side of the support or rail. The length of the sloped surface 608 that extends from the rail increases from the front of the rack mount to the back of the rack mount. The blocks 604 and 606 each are connected to a corresponding spring 610, 612, which are attached to the support. The spring acts to force the blocks in a direction as indicated at 614 and 616, respectively. Many configurations of one or more springs can provide such a force, and the invention is not limited to the configuration shown in FIG. 16. Each arm 600 and 602 is connected to a rotating connector 618, which rotates about an axis 620. A third arm 622 also is connected to the rotating connector 618 at one end, and to the button 624 (314 in FIGS. 14 and 15) on the other end.

When a disk drive enclosure is slid into a bay on the rack mount, the mechanical interlocks push the blocks 604 and 606 out of the way, then are stopped at the end of the rails by the detents as shown in FIG. 15. The force from the mechanical interlocks on the blocks causes the connector 618 to rotate about axis 620. After the mechanical interlocks pass the blocks 604 and 606, the springs 610 and 612 force the block back to their original position, thus retaining the enclosure and preventing the enclosure from moving backward. To remove the enclosure, button 624 is pressed, causing the connector 618 to rotate about axis 620, thus pulling blocks 604 and 606 inward. The disk drive enclosure then may be removed. The springs 610 and 612 force the button and blocks back to their original positions. This quick release mechanism allows fast installation and removal of a disk drive enclosure.

The combination of heat and noise reduction, a printed board circuit connector and mechanical interlocks provides a disk drive enclosure that is particularly suited to multimedia production environments by reducing noise and improving reliability. The ability to place such enclosures in a stack (in either an unlocked or a locked configuration), in a rack or on a desktop improves its portability and simplifies maintenance of data integrity of striped data.

Having now described a few embodiments, it should be apparent to those skilled in the art that the foregoing is merely illustrative and not limiting, having been presented by way of example only. Numerous modifications and other embodiments are within the scope of one of ordinary skill in the art and are contemplated as falling within the scope of the invention.

What is claimed is:

1. A disk drive enclosure, comprising:
   a housing for enclosing a disk drive;
   a first plurality of mechanical interlocks mounted on a first side of the housing;
   a second plurality of mechanical interlocks mounted on a second side of the housing opposite the first side of the housing; wherein each of the first and second plurality of mechanical interlocks has a top portion having a surface complementary to a surface of a bottom portion of the mechanical interlock, such that the top portion of a first mechanical interlock and the bottom portion of a second mechanical interlock are slidably connectable in a first direction and when connected prohibit movement of the mechanical interlocks with respect to each other in second and third directions orthogonal to the first direction.

2. The disk drive enclosure of claim 1, wherein the top portion has top face and the bottom portion has a bottom face such that the top face of the top portion of a first mechanical interlock supports the bottom face of the bottom portion of a second mechanical interlock when enclosures on which the first and second mechanical interlocks are attached are vertically aligned and stacked.

3. The disk drive enclosure of claim 1, wherein each of the first and second plurality of mechanical interlocks has portion having a surface complementary to a surface of a support in a rack, such that the portion of the mechanical interlock and the support in the rack are slidably connectable in a first direction and when connected prohibit movement of the mechanical interlock with respect to support in second and third directions orthogonal to the first direction.

4. The disk drive enclosure of claim 1, further comprising:
   a locking mechanism having a first movable member mounted on the first side of the housing.

5. A disk drive enclosure for mounting in a rack having a support, comprising:
   a housing for enclosing a disk drive;
   a first plurality of mechanical interlocks mounted on a first side of the housing;
   a second plurality of mechanical interlocks mounted on a second side of the housing opposite the first side of the housing;
   wherein each of the first and second plurality of mechanical interlocks has portion having a surface complementary to a surface of the support in the rack, such that the portion of the mechanical interlock and the support in the rack are slidably connectable in a first direction and when connected prohibit movement of the mechanical interlock with respect to support in second and third directions orthogonal to the first direction.

6. A mechanical interlock for use with a disk drive enclosure comprising a top portion, a bottom portion and a section connecting the top portion to the bottom portion, wherein the top portion has a surface complementary to a surface of the bottom portion, such that the top portion of a first mechanical interlock and the bottom portion of a second mechanical interlock are slidably connectable in a first direction and when connected prohibit movement of the mechanical interlocks with respect to each other in a second and directions orthogonal to the first direction.

7. The mechanical interlock of claim 6, wherein the top portion has top face and the bottom portion has a bottom face such that the top face of the top portion of a first mechanical interlock supports the bottom face of the bottom portion of a second mechanical interlock when enclosures on which the first and second mechanical interlocks are attached are vertically aligned and stacked.

8. A rack mount for a disk drive enclosure having at least one bay for receiving the disk drive enclosure, and comprising:
   a support mechanism having edges shaped to engage an interlock on the disk drive enclosure to guide the disk drive enclosure into the bay;
   a spring loaded block shaped to engage the interlock on the disk drive enclosure so as to permit the interlock to pass the blocks in a first direction and to prohibit passage of the interlock in a second direction opposite the first direction; and
   a user-operable member constructed to move the spring loaded block to permit passage of the interlock in the second direction to permit removal of the disk drive enclosure from the rack mount.

* * * * *